(12) United States Patent
Jacob et al.

US009190411B2

(10) Patent No.: US 9,190,411 B2
(45) Date of Patent: Nov. 17, 2015

(54) RETROGRADE DOPED LAYER FOR DEVICE ISOLATION

(71) Applicants: GLOBALFOUNDRIES Inc., Grand Cayman (KY); International Business Machines Corporation, Armonk, NY (US); Renesas Electronics Corporation, Kanagawa (JP)

(72) Inventors: Ajey Poovannummoottil Jacob, Albany, NY (US); Steven John Bentley, Watervliet, NY (US); Murat Kerem Akarvardar, Saratoga Springs, NY (US); Jody Alan Fronheiser, Delmar, NY (US); Kangguo Cheng, Schenectady, NY (US); Bruce B. Doris, Slingerlands, NY (US); Ali Khakifirooz, Mountain View, CA (US); Toshiharu Nagumo, Kanagawa (JP)

(73) Assignee: GlobalFoundries Inc., Grand Cayman (KY)

( * ) Notice: Subject to any disclaimer, the term of this patent is extended or adjusted under 35 U.S.C. 154(b) by 91 days.

(21) Appl. No.: 13/914,808

(22) Filed: Jun. 11, 2013

(65) Prior Publication Data
US 2014/0361377 A1 Dec. 11, 2014

(51) Int. Cl.
| | |
|---|---|
| *H01L 21/84* | (2006.01) |
| *H01L 21/8238* | (2006.01) |
| *H01L 27/092* | (2006.01) |
| *H01L 27/12* | (2006.01) |
| *H01L 29/66* | (2006.01) |
| *H01L 29/78* | (2006.01) |

(52) U.S. Cl.
CPC .... *H01L 27/0924* (2013.01); *H01L 21/823821* (2013.01); *H01L 21/845* (2013.01); *H01L 27/1211* (2013.01); *H01L 29/66795* (2013.01); *H01L 29/7851* (2013.01); *H01L 29/66439* (2013.01)

(58) Field of Classification Search
CPC .................. H01L 27/0924; H01L 27/10879; H01L 27/1211; H01L 21/845; H01L 21/823821; H01L 29/66795
See application file for complete search history.

(56) References Cited

U.S. PATENT DOCUMENTS

| | | | |
|---|---|---|---|
| 8,466,490 | B2 | 6/2013 | Liu et al. |
| 8,476,145 | B2 | 7/2013 | Or-Bach et al. |
| 8,803,242 | B2 | 8/2014 | Marino et al. |
| 2007/0023756 | A1 | 2/2007 | Anderson et al. |
| 2007/0122953 | A1 | 5/2007 | Liu et al. |
| 2007/0128782 | A1* | 6/2007 | Liu et al. ........................ 438/187 |
| 2011/0248352 | A1* | 10/2011 | Shifren et al. ................ 257/369 |
| 2014/0252479 | A1* | 9/2014 | Utomo et al. ................ 257/347 |

* cited by examiner

*Primary Examiner* — Phat X Cao
(74) *Attorney, Agent, or Firm* — Williams Morgan, P.C.

(57) ABSTRACT

Embodiments herein provide device isolation in a complimentary metal-oxide fin field effect transistor. Specifically, a semiconductor device is formed with a retrograde doped layer over a substrate to minimize a source to drain punch-through leakage. A set of high mobility channel fins is formed over the retrograde doped layer, each of the set of high mobility channel fins comprising a high mobility channel material (e.g., silicon or silicon-germanium). The retrograde doped layer may be formed using an in situ doping process or a counter dopant retrograde implant. The device may further include a carbon liner positioned between the retrograde doped layer and the set of high mobility channel fins to prevent carrier spill-out to the high mobility channel fins.

20 Claims, 12 Drawing Sheets

RETROGRADE DOPED LAYER FOR DEVICE ISOLATION

BACKGROUND

1. Technical Field

This invention relates generally to the field of semiconductors, and more particularly, to approaches used to form a complementary metal-oxide field effect transistor.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FINFETs)) and connect the devices into circuits. In a typical state of the art complementary insulated gate FINFET process, such as what is normally referred to as CMOS, layers are formed on a wafer to form the devices on a surface of the wafer. Further, the surface may be the surface of a silicon layer on a silicon on insulator (SOI) wafer. A simple FINFET is formed by the intersection of two shapes, i.e., a gate layer rectangle on a silicon island formed from the silicon surface layer. Each of these layers of shapes, also known as mask levels or layers, may be created or printed optically through well known photolithographic masking, developing and level definition, e.g., etching, implanting, deposition and etc.

Silicon based FinFETs have been successfully fabricated using conventional MOSFET technology. A typical FinFET is fabricated on a substrate with an overlying insulating layer with a thin 'fin' extending from the substrate, for example, etched into a silicon layer of the substrate. The channel of the FET is formed in this vertical fin. A gate is provided over the fin(s). A double gate is beneficial in that there is a gate on both sides of the channel allowing gate control of the channel from both sides. Further advantages of FinFETs include reducing the short channel effect and higher current flow. Other FinFET architectures may include three or more effective gates.

It is currently known that performance improvement in a bulk finFET can be increased by adding high mobility channel materials. Germanium based devices (Ge-FinFET) include a fin formed at least in part, of germanium (as opposed to silicon fin). Typical Ge-FinFET fabrication includes patterning a germanium layer on a substrate to form a narrow Ge-fin. However, even high mobility channel materials like Ge have aggravated junction leakage if the device interface is not properly engineered. As shown by the prior art device 10 of FIG. 1, the bulk FinFET suffers from punch-through leakage along the fin channel, which significantly contributes to overall device leakage. Furthermore, prior art device 10 is highly susceptible to damage during punch-through implant, and suffers from carrier spill-out to the undoped fin channel, which lowers the carrier mobility. Accordingly, what is needed is a solution to at least one of these deficiencies.

SUMMARY

In general, embodiments herein provide device isolation in a complimentary metal-oxide-semiconductor (CMOS) fin field effect transistor (finFET). Specifically, a semiconductor device is formed with a retrograde doped layer over a substrate to minimize a source to drain punch-through leakage. A set of high mobility channel fins is formed over the retrograde doped layer, each of the set of high mobility channel fins comprising a high mobility channel material (e.g., Si or silicon-germanium). The retrograde doped layer may be formed using an in situ doping process or a counter dopant retrograde implant. The device may further include a carbon liner formed over the retrograde doped layer to prevent carrier spill-out to the high mobility channel fins.

One aspect of the present invention includes a method for forming a device, the method comprising: forming a retrograde doped layer over a substrate, the retrograde doped layer comprising one of: doped silicon (Si), and doped silicon-germanium (Si—Ge); forming a set of high mobility channel fins over the retrograde doped layer, each of the set of high mobility channel fins comprising at least one of: Si, and Si—Ge; and forming a set of silicon fins adjacent the set of high mobility channel fins.

Another aspect of the present invention includes a method for providing device isolation in a complementary metal-oxide-semiconductor fin field effect transistor, the method comprising: forming a retrograde doped layer over a substrate, the retrograde doped layer comprising one of: doped silicon (Si), and doped silicon-germanium (Si—Ge); forming a set of high mobility channel fins over the retrograde doped layer, each of the set of high mobility channel fins comprising at least one of: Si, and Si—Ge; and forming a set of silicon fins adjacent the set of high mobility channel fins.

Another aspect of the present invention includes a semiconductor device comprising: a retrograde doped layer formed over a substrate, the retrograde doped layer comprising one of: doped silicon (Si), and doped silicon-germanium (Si—Ge); a set of high mobility channel fins formed over the retrograde doped layer, each of the set of high mobility channel fins comprising at least one of: Si, and Si—Ge; and a set of silicon fins formed adjacent the set of high mobility channel fins.

BRIEF DESCRIPTION OF THE DRAWINGS

These and other features of this invention will be more readily understood from the following detailed description of the various aspects of the invention taken in conjunction with the accompanying drawings in which.

Figure 1:
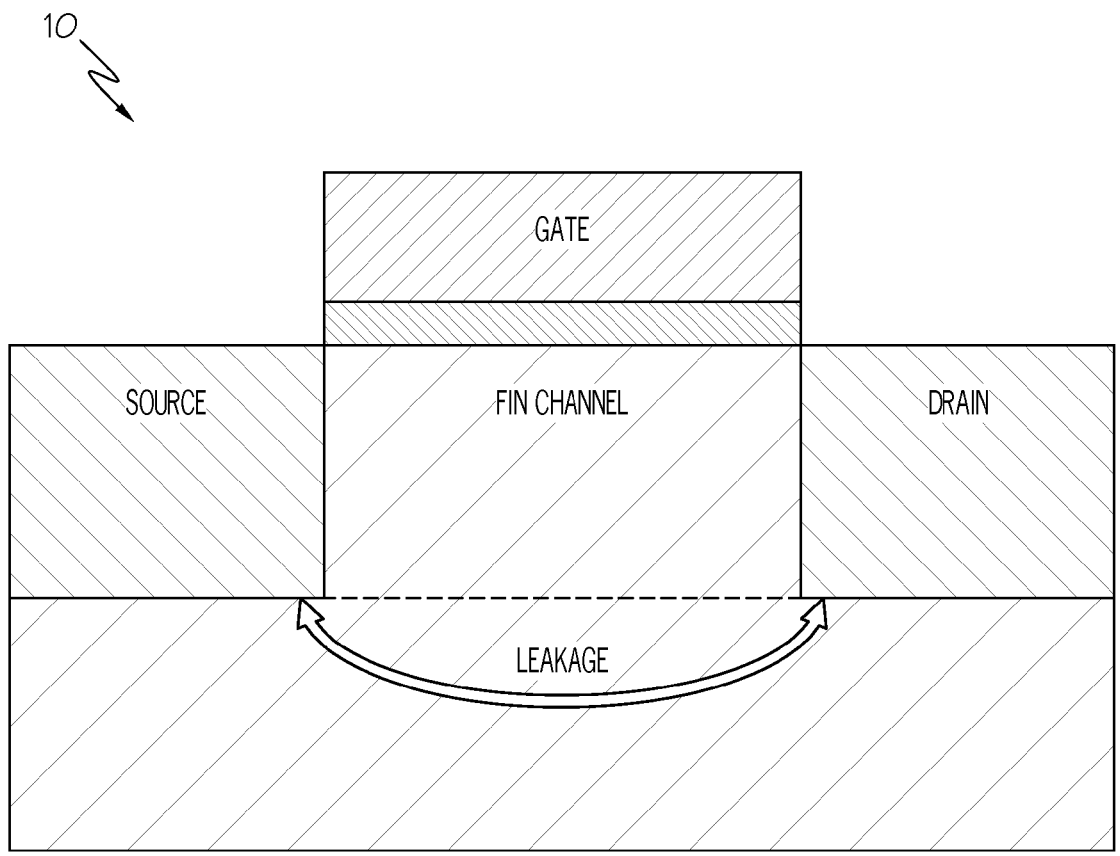
FIG. 1 shows a cross-sectional view of a prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for device isolation in a complementary metal-oxide finFET (e.g., a bulk finFET). Specifically, a semiconductor device is formed with a retrograde doped layer over a substrate to minimize a source to drain punch-through leakage. A set of high mobility channel fins is formed over the retrograde doped layer, each of the set of high mobility channel fins comprising a high mobility channel material (e.g., silicon or silicon-germanium). The retrograde doped layer may be formed using an in situ doping process or a counter dopant retrograde implant. The device may further include a carbon liner positioned between the retrograde doped layer and the set of high mobility channel fins to prevent carrier spill-out to the high mobility channel fins.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
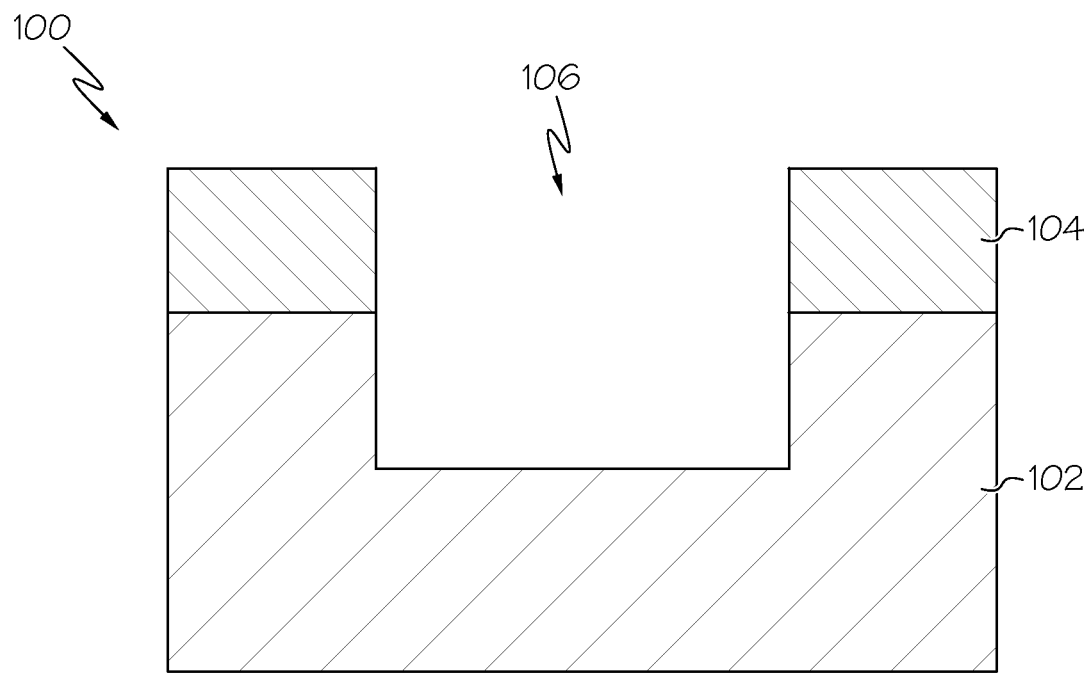
FIG. 2 shows a cross-sectional view of an opening formed in a substrate according to illustrative embodiments.

With reference again to the figures, FIG. 2 shows a cross sectional view of a device 100 according to an embodiment of the invention. Device 100 comprises a substrate 102 and a hard mask 104 formed over substrate 102. As shown, an opening 106 is formed in substrate 102. Opening 106 is patterned, for example, using a photolithography processes or other lithographic process (e.g., electron beam lithography, imprint lithography, etc.), and removed by a suitable etching process including a wet etch, dry etch, plasma etch, and the like. In one embodiment, hard mask 104 comprises SiN or SiO2, and substrate 102 includes a silicon substrate (e.g., wafer). Substrate 102 may be silicon in a crystalline structure (e.g., a bulk silicon substrate).

Figure 3:
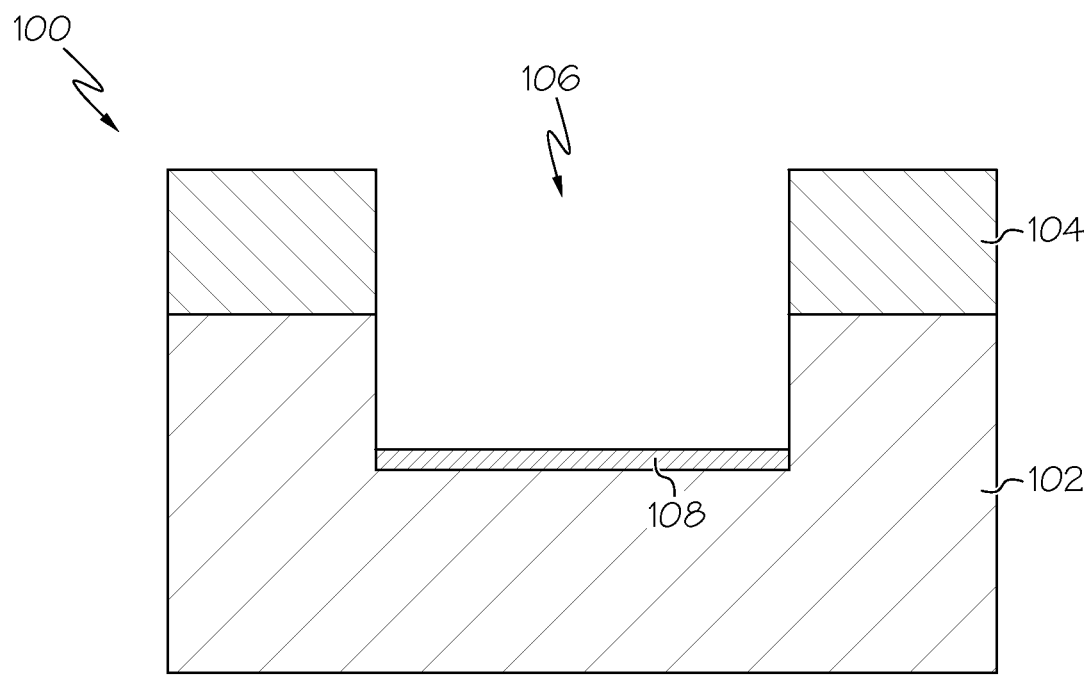
FIG. 3 shows a cross-sectional view of formation of a retrograde doped layer in the opening formed in the substrate according to illustrative embodiments.

Next, as shown in FIG. 3, a retrograde doped layer 108 is formed within opening 106 of substrate 102. In one embodiment, retrograde doped layer 108 is grown within opening 106 and doped using an in situ doping process. Retrograde doped layer 108 comprises Si or Si—Ge, and is grown by a CMOS compatible process, e.g., CVD. Retrograde doped layer 108 is doped using an in-situ doping technique wherein dopants are introduced to the Si/Si—Ge at the same time the Si/Si—Ge is being deposited. In one embodiment, the Si/Si—Ge of retrograde doped layer 108 is counter doped, e.g., with arsenic, antimony, or phosphorus, to ensure proper isolation. In alternative embodiments, retrograde doped layer 108 comprises doped N+Silicon/SiC Silicon layers (for PMOS), doped P+Silicon/SiC silicon layers (for NMOS), doped N+SiGe/SiGeC layers (for PMOS), or doped P+SiGe/SiGeC (for NMOS). In these embodiments, the Silicon NMOS may be strained as well.

Figure 4:
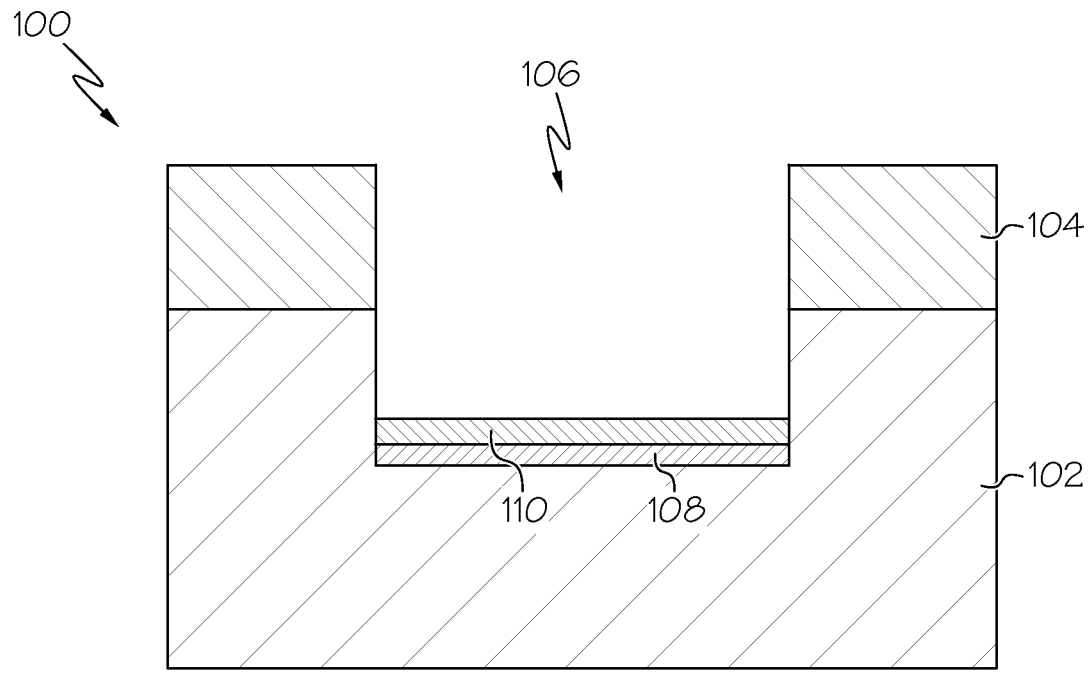
FIG. 4 shows a cross-sectional view of formation of a carbon liner over the retrograde doped layer according to illustrative embodiments.
Figure 5:
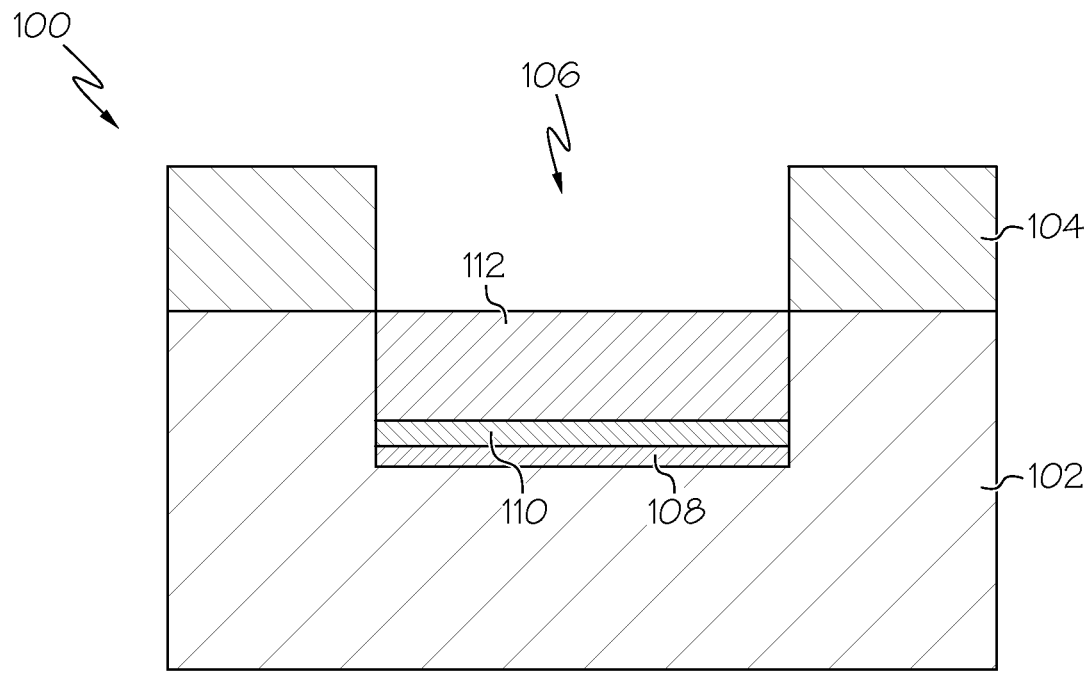
FIG. 5 shows a cross-sectional view of formation of a high mobility channel material according to illustrative embodiments.

As shown in FIG. 4, device 100 further comprises a carbon liner 110 formed over the retrograde doped layer 108 within opening 106. In one embodiment, carbon liner 110 comprises Silicon Germanium:Carbon (SiGe:C), which is grown over retrograde doped layer 108. A high mobility channel material 112 is then formed over carbon liner 110, as shown in FIG. 5. In one embodiment, high mobility channel material 112 (i.e., Si or Si—Ge) is grown over carbon liner 110 within opening 106 using CVD. Next, hardmask 104 is then removed, resulting in device 100 shown in FIG. 6.

Figure 7:
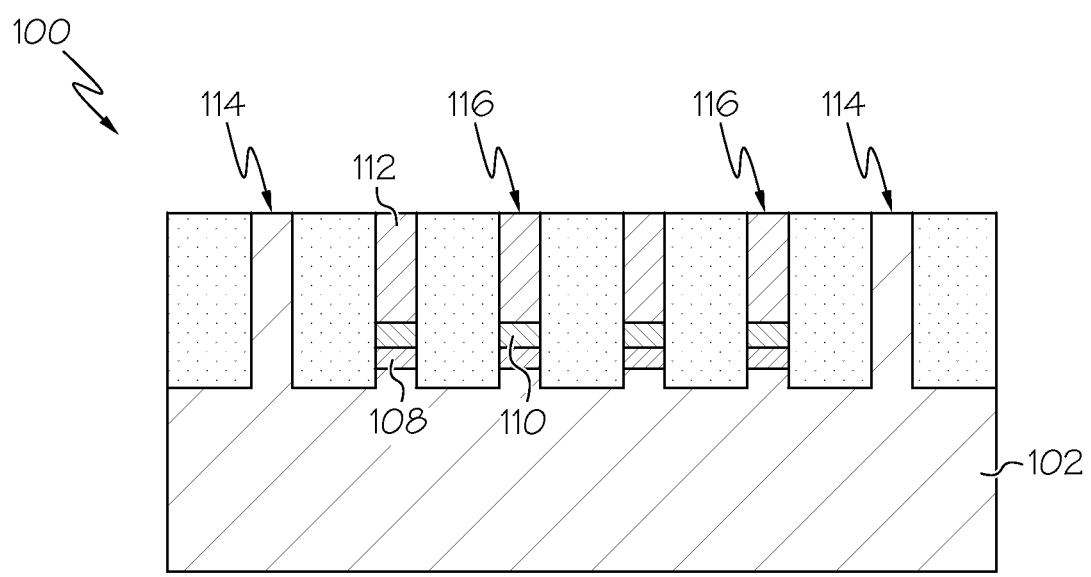
FIG. 7 shows a cross-sectional view of a set of high mobility channel fins formed over the retrograde doped layer and the carbon liner according to illustrative embodiments.

As shown in FIG. 7, a set of fins 114 (i.e., silicon fins) and a set of high mobility channel fins 116 are then patterned and formed over substrate 102. Fins 114 and high mobility channel fins 116 may be fabricated using any suitable process including one or more photolithography and etch processes. The photolithography process may include forming a photoresist layer (not shown) overlying substrate 102 (e.g., on a silicon layer), exposing the resist to a pattern, performing post-exposure bake processes, and developing the resist to form a masking element including the resist. The masking element may then be used to etch fins 114 into the silicon layer, e.g., using reactive ion etch (RIE) and/or other suitable processes, and etch high mobility channel fins 116 into high mobility channel material 112. In one embodiment, fins 114 and high mobility channel fins 116 are formed using a sidewall image transfer technique. In another embodiment, fins 114 are formed by a double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

Figure 8:
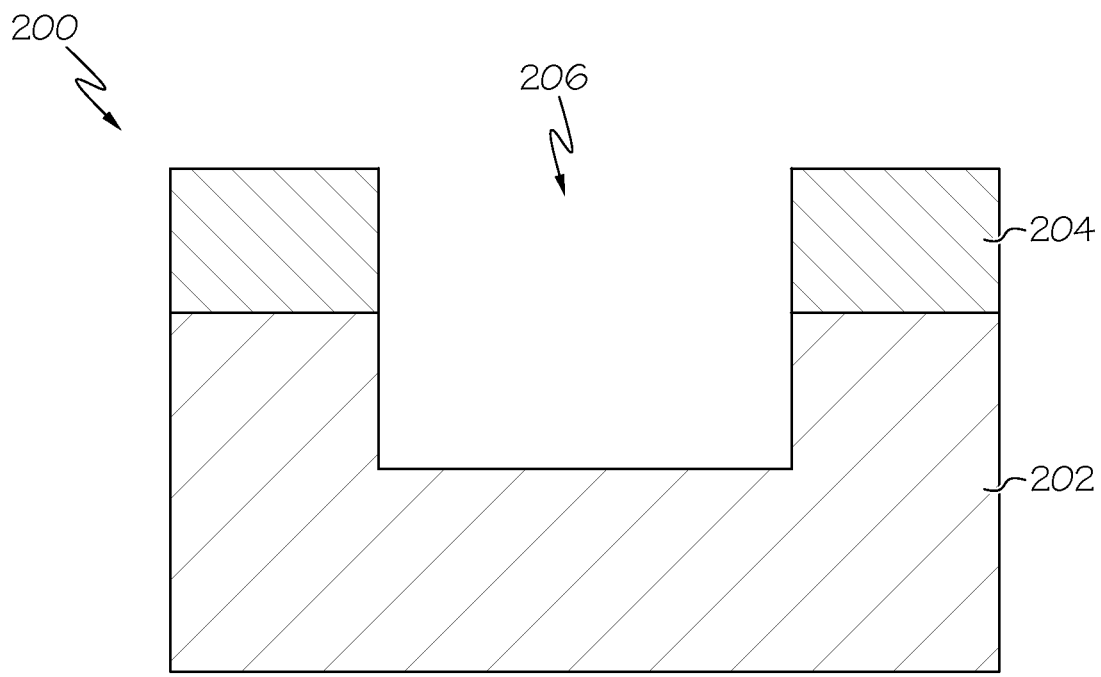
FIG. 8 shows a cross-sectional view of an opening formed in the substrate according to illustrative embodiments.

Referring now to FIG. 8, a cross sectional view of a device 200 according to an embodiment of the invention is shown. Device 200 comprises a substrate 202 and a hard mask 204 formed over substrate 202. As shown, an opening 206 is formed in substrate 202. Opening 206 is patterned, for example, using a photo-lithography processes or other lithographic process (e.g., electron beam lithography, imprint lithography, etc.), and removed by a suitable etching process including a wet etch, dry etch, plasma etch, and the like. In one embodiment, hard mask 104 comprises SiN or SiO2, and substrate 202 includes a silicon substrate (e.g., wafer). Substrate 202 may be silicon in a crystalline structure (e.g., a bulk silicon substrate).

Figure 9:
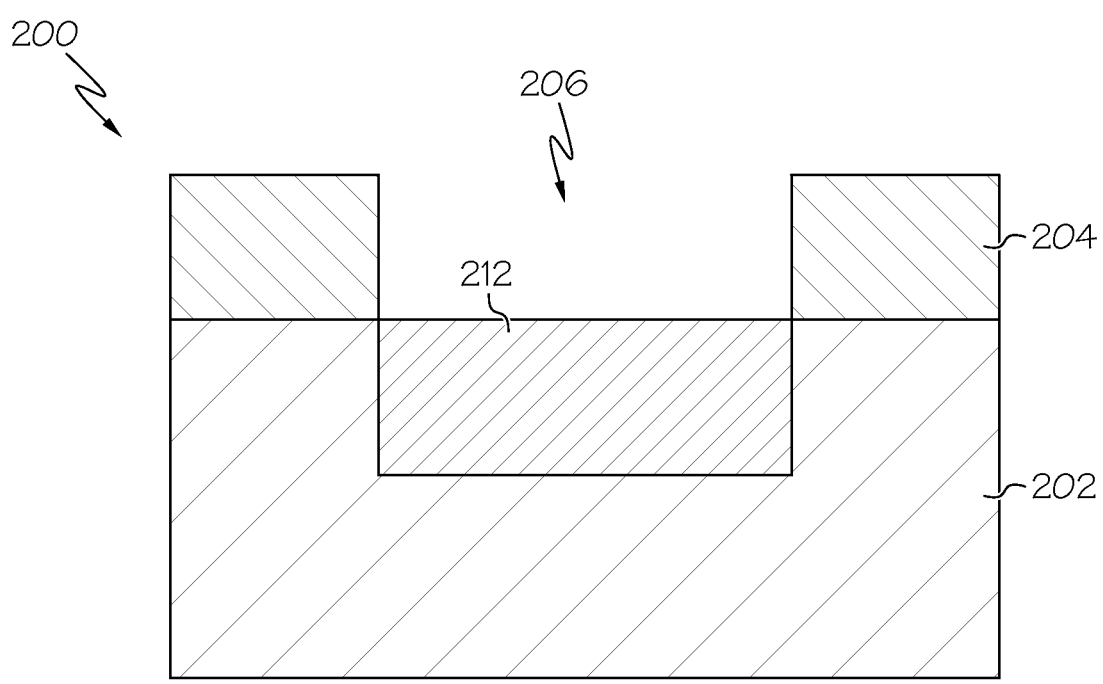
FIG. 9 shows a cross-sectional view of formation of a high mobility channel material according to illustrative embodiments.
Figure 10:
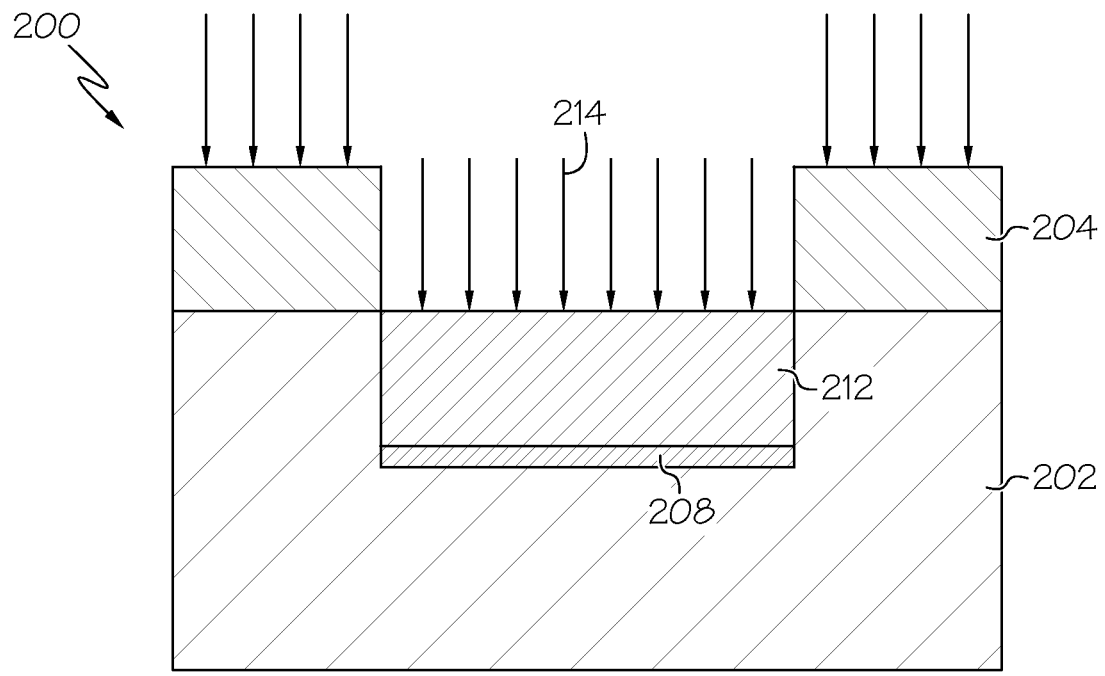
FIG. 10 shows a cross-sectional view of formation of a retrograde doped layer according to illustrative embodiments.

Next, as shown in FIG. 9, a high mobility channel material 212 is formed over substrate 202 within opening 206. In this embodiment, high mobility channel material 212 is grown within opening 206 using an in situ process. A retrograde doped layer 208 is then formed over substrate 202, as shown in FIG. 10. In this embodiment, retrograde doped layer 208 is formed along a bottom edge/surface of high mobility channel material 212 and over substrate 202, e.g., via a counter dopant retrograde implant 214. Retrograde doped layer 208 comprises Si or Si—Ge, which is counter doped with N-type dopants (e.g., arsenic, antimony, or phosphorus) to ensure proper isolation.

Figure 6:
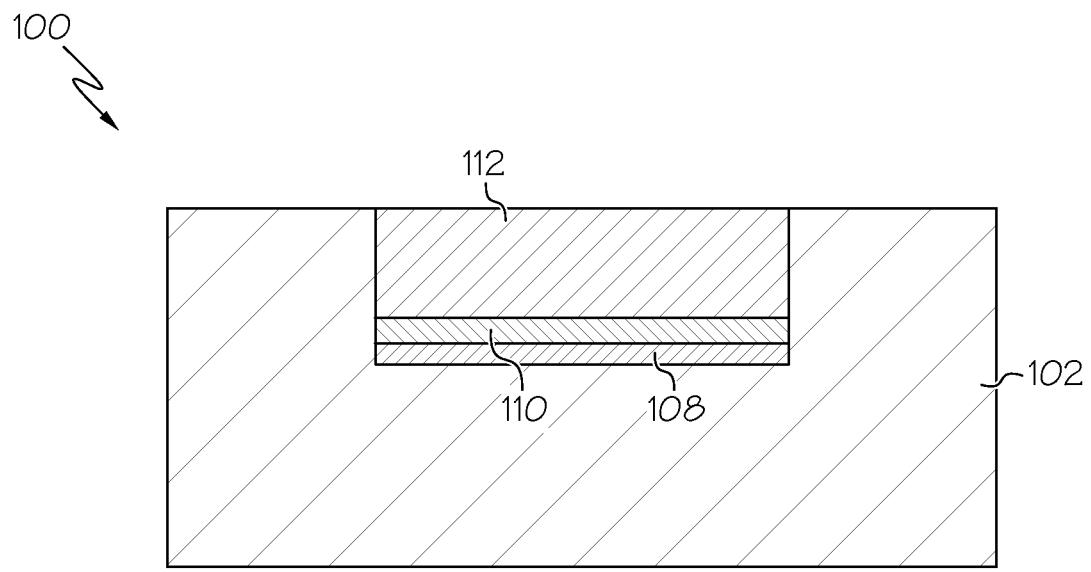
FIG. 6 shows a cross-sectional view of removal of a hardmask according to illustrative embodiments.
Figure 11:
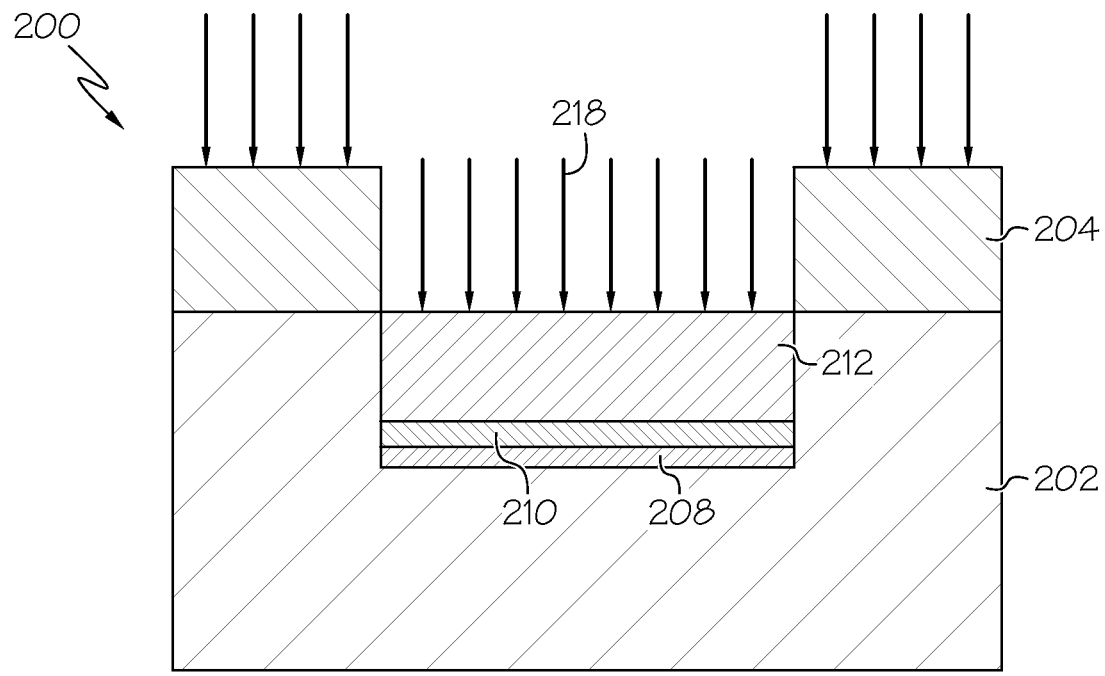
FIG. 11 shows a cross-sectional view of formation of a carbon liner according to illustrative embodiments.

Next, as shown in FIG. 11, carbon liner 210 is formed over retrograde doped layer 208 within substrate 202 using a retrograde carbon implant 218. The processing steps described and shown by FIGS. 6-7 are then repeated to remove hardmask 204 and form the silicon fins and high mobility channel fins over substrate 102.

Figure 12:
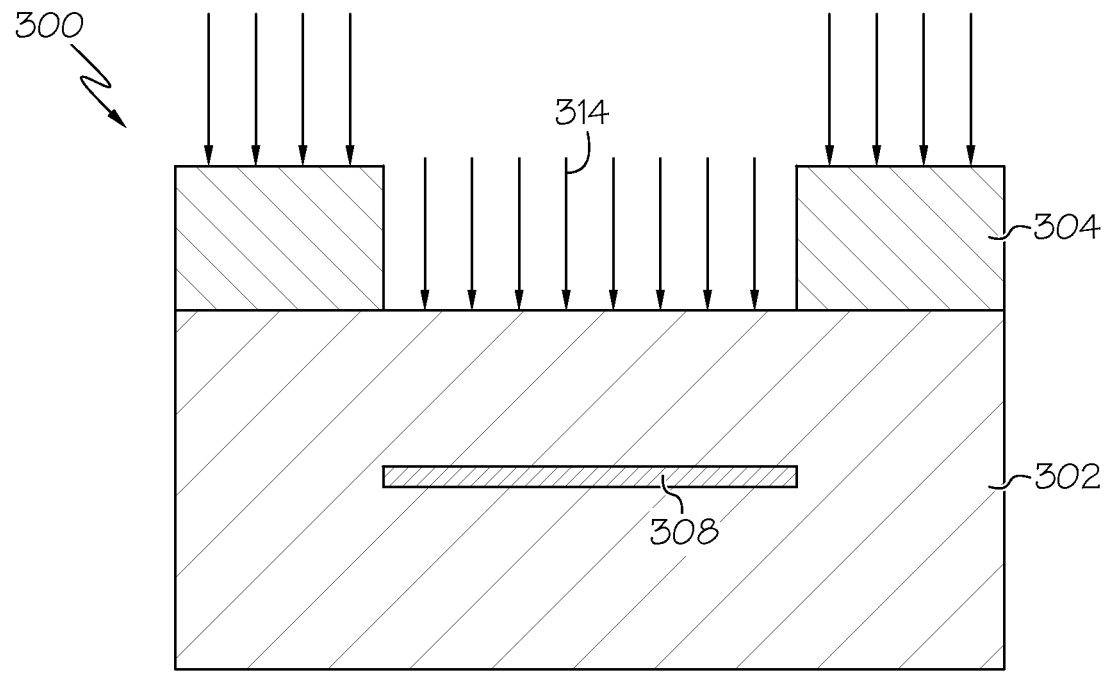
FIG. 12 shows a cross-sectional view of formation of a retrograde doped layer according to illustrative embodiments.

Turning now to FIG. 12, a cross sectional view of a device 300 according to an embodiment of the invention is shown. Device 300 comprises a substrate 302 and a hard mask 304 formed over substrate 302. As shown, retrograde doped layer 308 is formed within substrate 302, e.g., via a counter dopant retrograde implant process 314. In this embodiment, retrograde doped layer 308 comprises Si or Si—Ge, which is counter doped (e.g., with arsenic, antimony, or phosphorus) to ensure proper isolation. To accomplish this, hardmask 304 is formed and patterned over substrate 302, and dopant implantation process 314 is performed.

Figure 13:
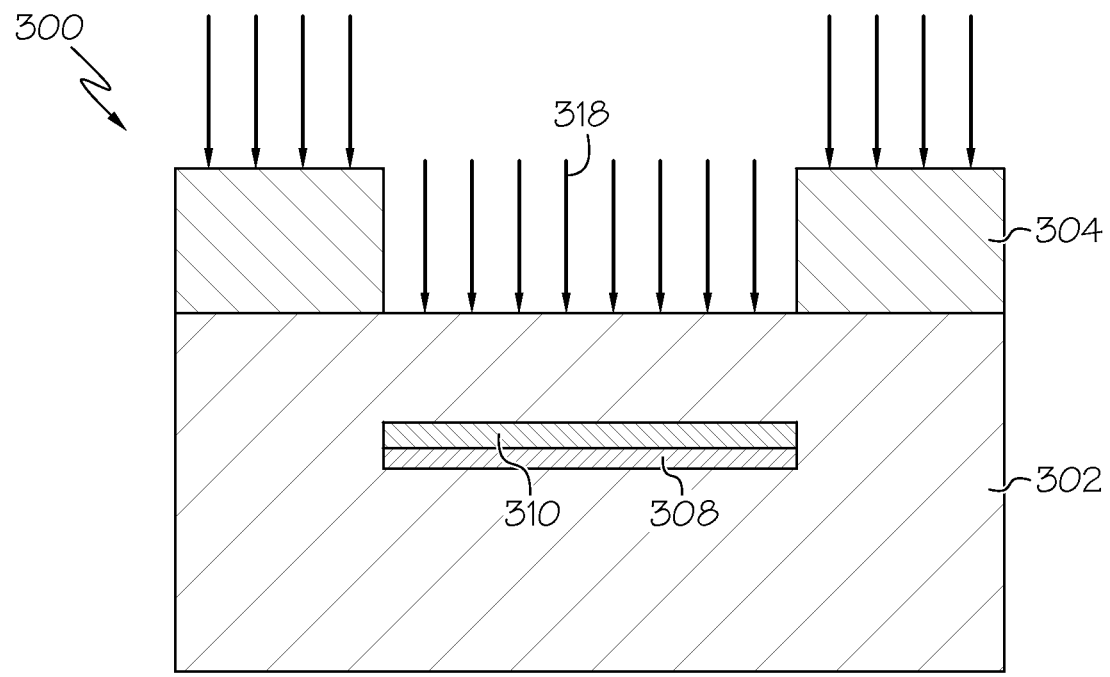
FIG. 13 shows a cross-sectional view of formation of a carbon liner according to illustrative embodiments.

Next, as shown in FIG. 13, carbon liner 310 is formed over retrograde doped layer 308 within substrate 302 using a retrograde carbon implant 318. Although not shown for the sake of brevity, a high mobility channel material is then formed within an opening patterned over carbon liner 310, and the processing steps described and shown by FIGS. 6-7 are repeated to remove hardmask 304 and form the silicon fins and high mobility channel fins over substrate 302.

Figure 14:
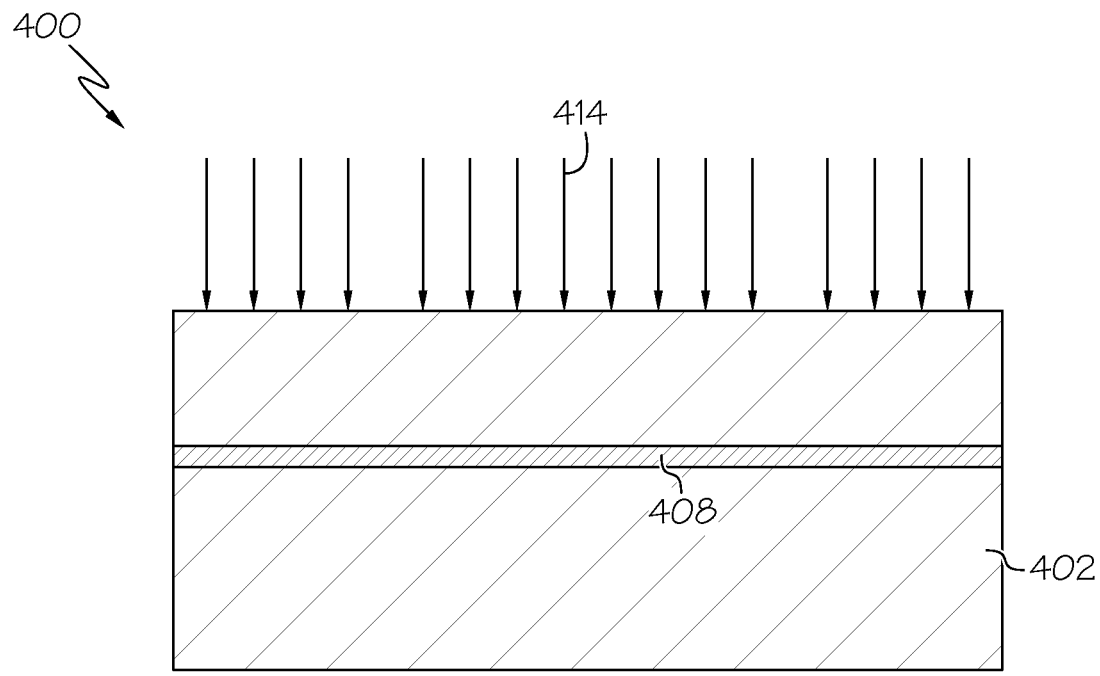
FIG. 14 shows a cross-sectional view of formation of a retrograde doped layer according to illustrative embodiments.
Figure 15:
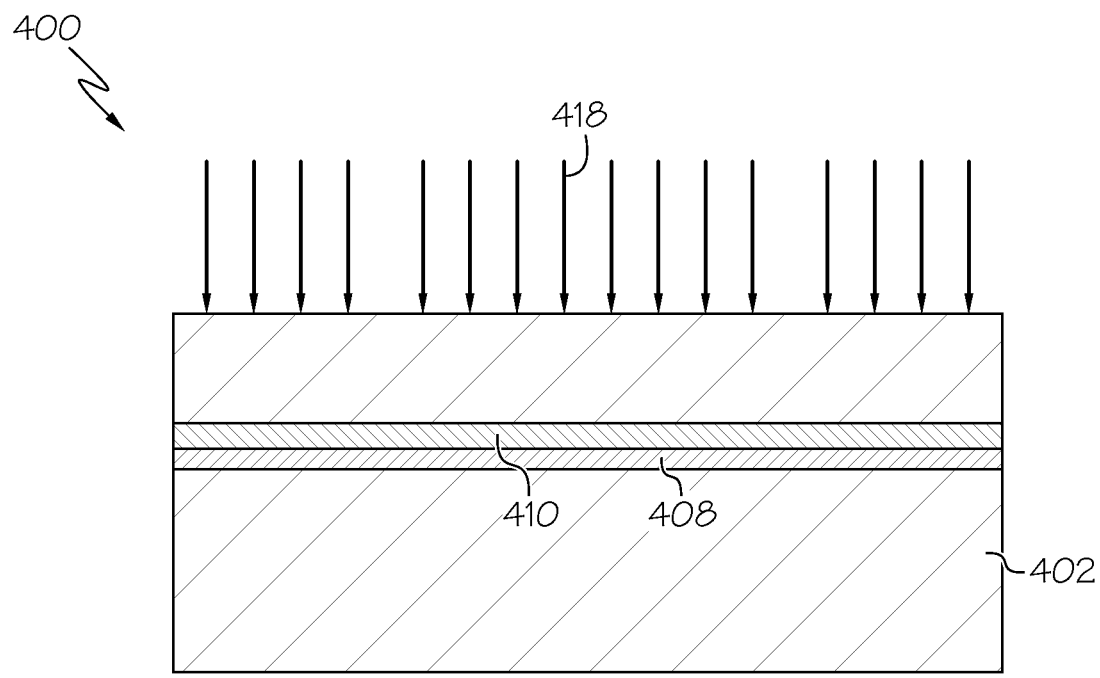
FIG. 15 shows a cross-sectional view of formation of a carbon liner according to illustrative embodiments.
Figure 16:
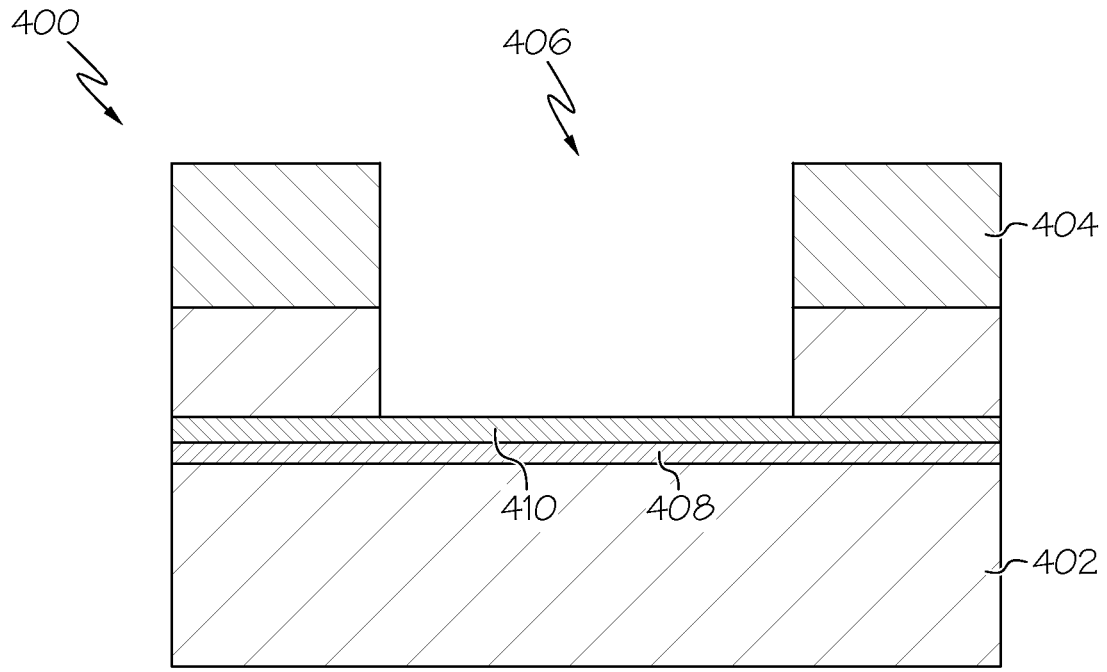
FIG. 16 shows a cross-sectional view of formation of an opening in the substrate according to illustrative embodiments.

Turning now to FIG. 14, a cross sectional view of a device 400 according to an embodiment of the invention is shown. Device 400 comprises a substrate 402 with retrograde doped layer 408 formed therein, e.g., via dopant implantation process 414. In this embodiment, retrograde doped layer 408 comprises Si or Si—Ge, which is counter doped (e.g., with arsenic, antimony, or phosphorus) to ensure proper isolation. As shown, no hardmask is present during this processing step. Dopant implantation process 414 therefore impacts all of substrate 402 and results in retrograde doped layer 408 being formed along the entire width of substrate 402. Carbon liner 410 is then formed over the retrograde doped layer 408 within substrate 402 using a retrograde carbon implant 418, as shown in FIG. 15. Similarly, carbon liner 410 is also formed along the entire width of substrate 402.

Figure 17:
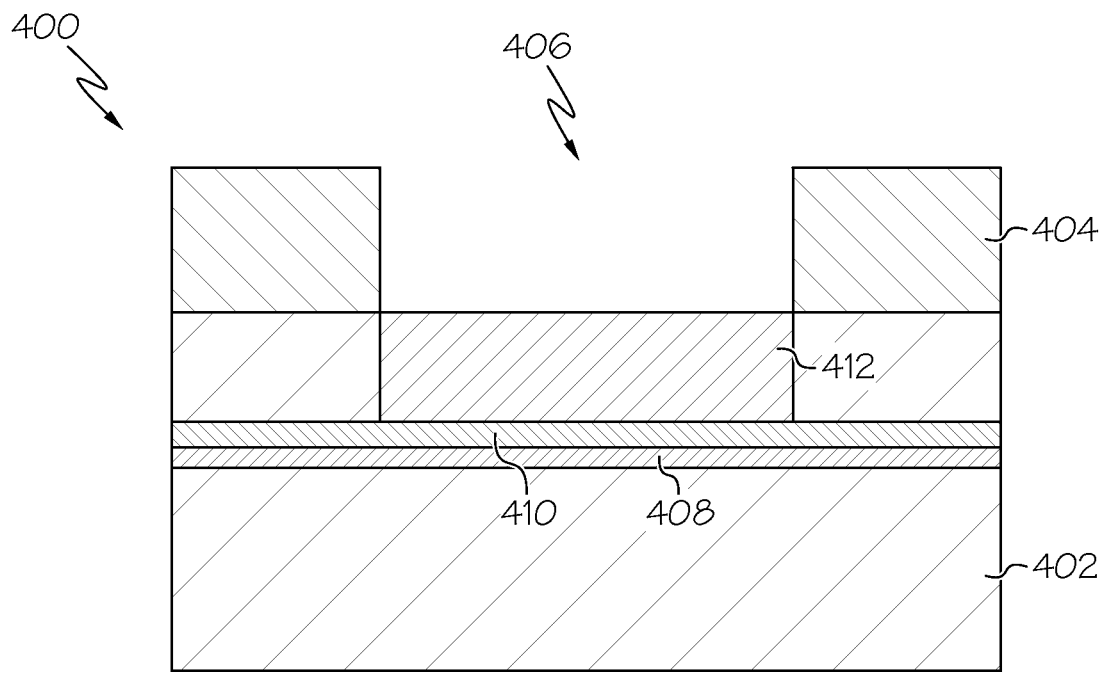
FIG. 17 shows a cross-sectional view of formation of formation of a high mobility channel material according to illustrative embodiments.
Figure 18:
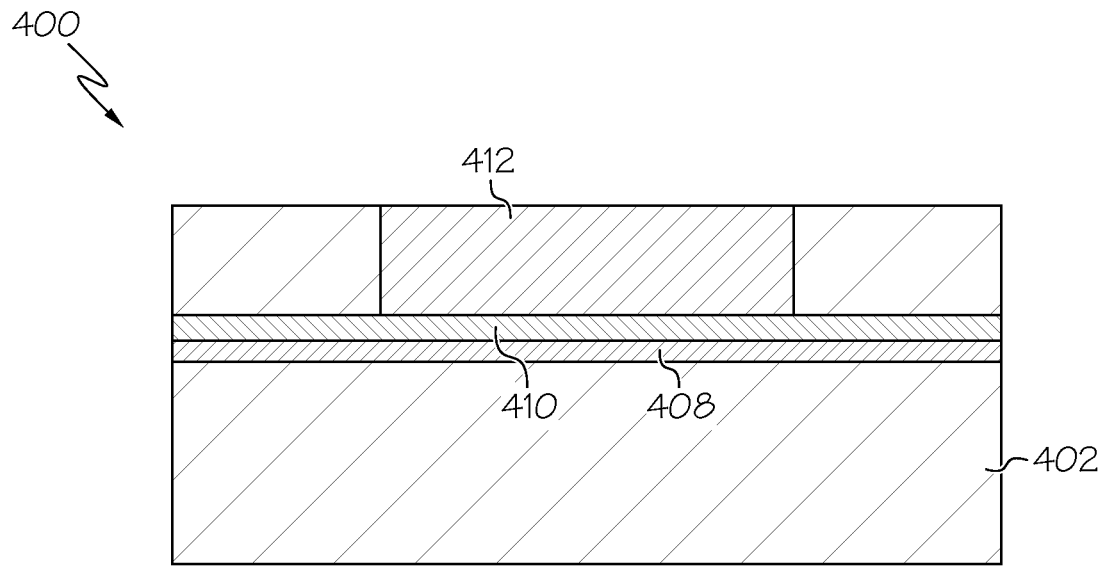
FIG. 18 shows a cross-sectional shows removal of the hardmask according to illustrative embodiments.

Next, opening 406 is formed in substrate 402. Opening 406 is patterned, for example, using a photo-lithography processes or other lithographic process (e.g., electron beam lithography, imprint lithography, etc.), and removed by a suitable etching process including a wet etch, dry etch, plasma etch, and the like. As shown, substrate 402 is removed to a top surface of carbon liner 410. High mobility channel material 412 is then formed over carbon liner 410 within opening 406, as shown in FIG. 17. In this embodiment, high mobility channel material 412 is grown within opening 406 using an in situ process. Hardmask 404 is then removed, resulting in the structure shown in FIG. 18

Figure 19:
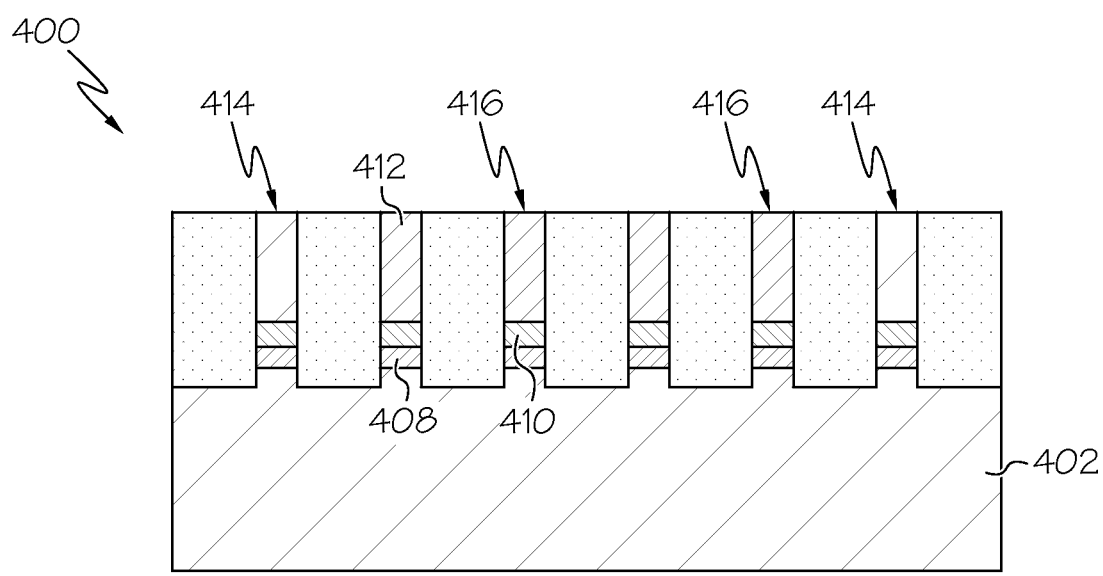
FIG. 19 shows a cross-sectional view shows formation of a set of high mobility channel fins over the substrate according to illustrative embodiments.

As shown in FIG. 19, a set of fins 414 (i.e., silicon fins) and a set of high mobility channel fins 416 are then patterned and formed over substrate 402. As a result, device 400 comprises a set of silicon fins 414 adjacent high mobility channel fins 416, wherein silicon fins 414 are also formed atop retrograde doped layer 408 and carbon liner 410. In this embodiment, the same retrograde well is used for both Silicon PFETS and SiGe PFETS. Each is formed on the same substrate 402 with the same retrograde well implants.

Figure 20:
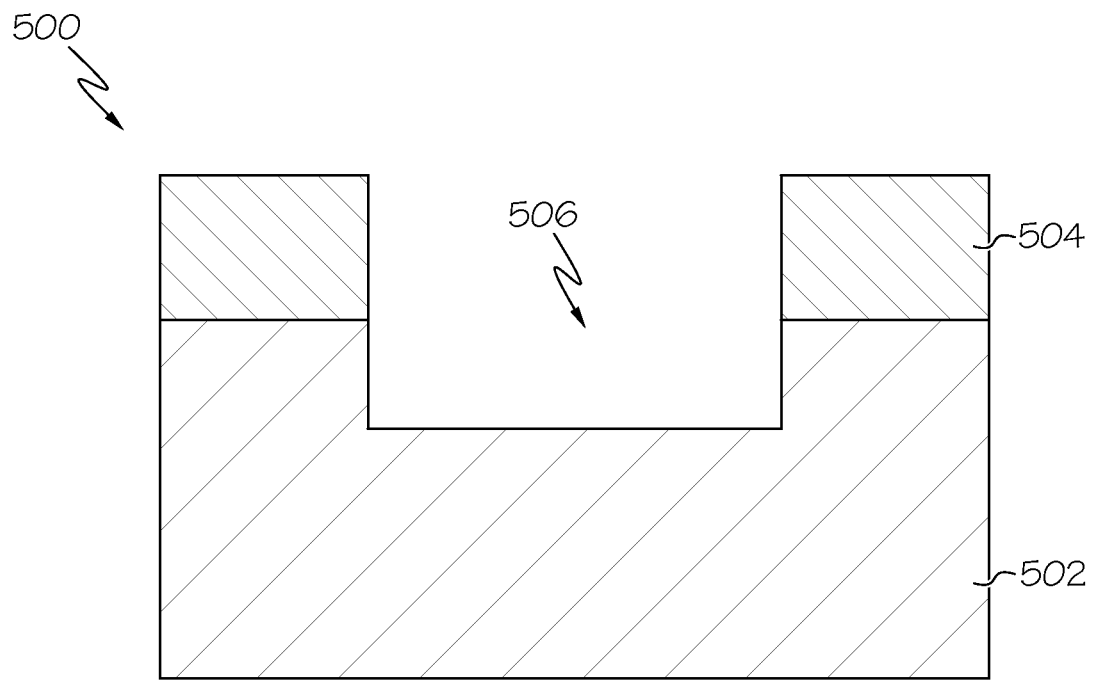
FIG. 20 shows a cross-sectional view of an opening formed in the substrate according to illustrative embodiments.
Figure 21:
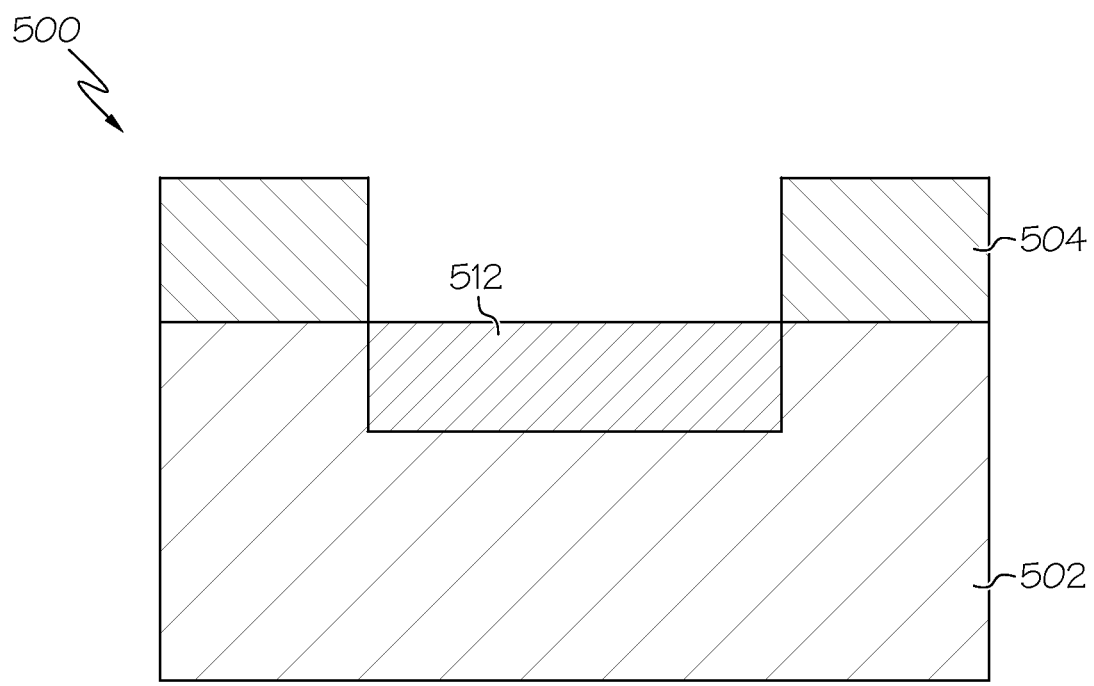
FIG. 21 shows a cross-sectional view of formation of the high mobility channel material according to illustrative embodiments.

Turning now to FIG. 20, a cross sectional view of a device 500 according to an embodiment of the invention is shown. Device 500 comprises a substrate 502 with opening 506 formed therein. High mobility channel material 512 is then formed over substrate 502 within opening 506, as shown in FIG. 21. In this embodiment, high mobility channel material 512 is grown within opening 506 using an in situ process.

Figure 22:
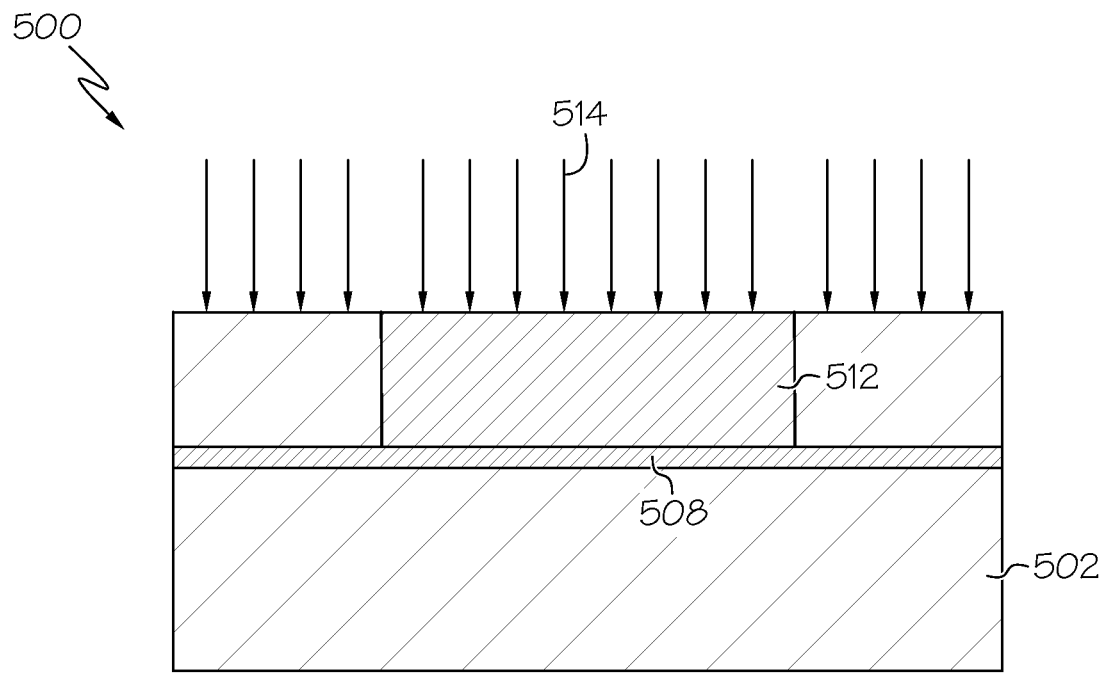
FIG. 22 shows a cross-sectional view of the formation retrograde doped layer according to illustrative embodiments.

Next, hardmask 504 is removed and retrograde doped layer 508 is formed over substrate 502, as shown in FIG. 22. In this embodiment, retrograde doped layer 508 is formed along a bottom edge of high mobility channel material 512 and within substrate 502, e.g., via a counter dopant retrograde implant 514. As shown, no hardmask is present during this processing step. Dopant implantation process 514 therefore impacts both high mobility channel material 512 and substrate 502, resulting in retrograde doped layer 508 being formed along the entire width of substrate 502. Retrograde doped layer 508 comprises Si or Si—Ge, which is counter doped with N-type dopants (e.g., arsenic, antimony, or phosphorus) to ensure proper isolation.

Figure 23:
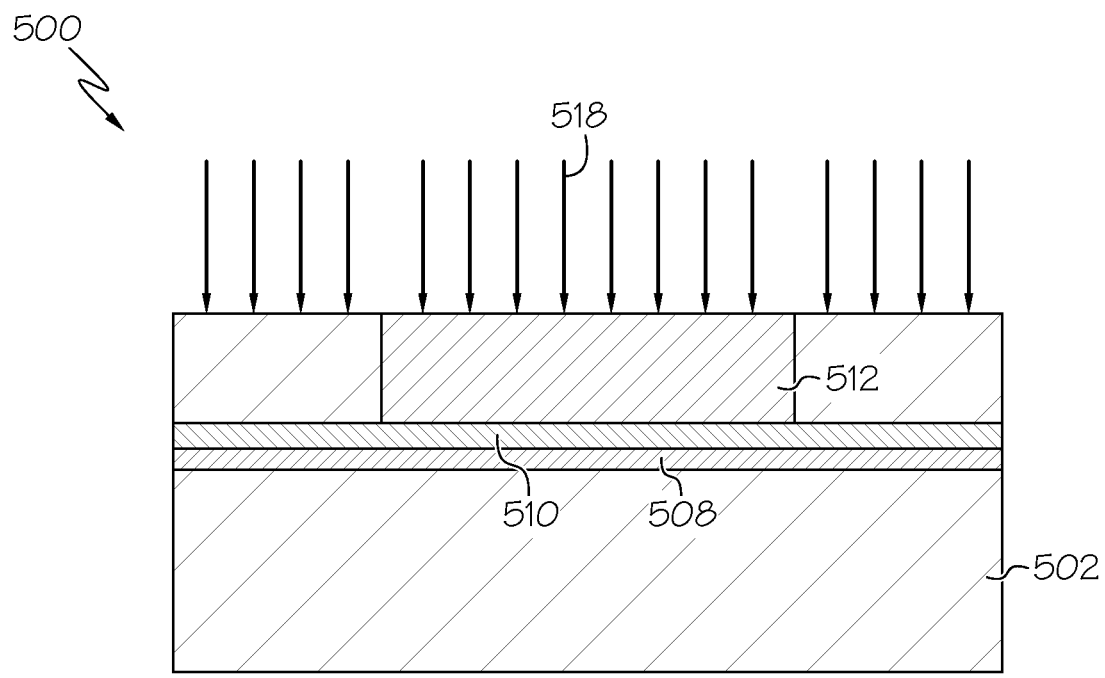
FIG. 23 shows a cross-sectional view of formation of the carbon layer over the retrograde doped layer according to illustrative embodiments.

Next, as shown in FIG. 23, carbon liner 510 is formed over retrograde doped layer 508 within substrate 502 using a retrograde carbon implant 518. Retrograde carbon implant 518 impacts both high mobility channel material 512 and substrate 502, resulting in retrograde carbon implant being formed along the entire width of substrate 502. The processing steps described and shown in FIG. 19 are then repeated to form the silicon fins and high mobility channel fins over substrate 502.

Although not shown, it will be appreciated that a set of gate structures are then formed atop each device, i.e., devices 100, 200, 300, 400, and 500. In one embodiment, the gate structure includes a gate dielectric layer and a gate electrode. Numerous other layers may also be present, for example, capping layers, interface layers, spacer elements, and/or other suitable features. The gate dielectric layer may include dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($Hf_{O2}$-$A_{l2O3}$) alloy, and/or combinations thereof. The gate dielectric layer may be formed using processes such as, photolithography patterning, oxidation, deposition, etching, and/or other suitable processes. The gate electrode may include polysilicon, silicon-germanium, a metal including metal compounds such as, Mo, Cu, W, Ti, Ta, TiN, TaN, NiSi, CoSi, and/or other suitable conductive materials known in the art. The gate electrode may be formed using processes such as, physical vapor deposition (PVD), CVD, plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

Furthermore, in various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided device isolation in a complimentary metal-oxide fin field effect transistor. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
    forming a retrograde doped layer over a substrate, the retrograde doped layer comprising one of: doped silicon (Si), and doped silicon-germanium (Si—Ge);
    forming a set of high mobility channel fins over the retrograde doped layer, each of the set of high mobility channel fins comprising at least one of: Si, and Si—Ge; and
    forming a set of silicon fins adjacent the set of high mobility channel fins, the silicon fins having no retrograde doped layer formed beneath.

2. The method according to claim 1, further comprising forming a carbon liner over the retrograde doped layer.

3. The method according to claim 1, the forming the retrograde doped layer comprising performing an in situ doping process.

4. The method according to claim 3, the forming the set of high mobility channel fins comprising:
    depositing the high mobility channel material over the retrograde doped layer;
    patterning the high mobility channel material and the substrate; and
    etching the high mobility channel material and the substrate.

5. The method according to claim 4, the depositing comprising growing the high mobility channel material using a chemical vapor deposition of at least one of: Si, and Si—Ge.

6. The method according to claim 2, the forming the retrograde doped layer comprising:
    forming an opening in the substrate;
    depositing the high mobility channel material in the opening; and performing a counter dopant retrograde implant to form the retrograde doped layer over the substrate in the opening.

7. The method according to claim 6, further comprising performing a retrograde carbon implant to form the carbon liner over the retrograde doped layer.

8. The method according to claim 1, the forming the retrograde doped layer comprising performing a counter dopant retrograde implant to form the retrograde doped layer within the substrate.

9. The method according to claim 8, further comprising:
patterning an opening in a hardmask formed over the substrate prior to formation of the retrograde doped layer; and
performing a retrograde carbon implant to form the carbon liner over the retrograde doped layer.

10. A method for providing device isolation in a complementary metal-oxide-semiconductor fin field effect transistor, the method comprising:
forming a retrograde doped layer over a first portion of a substrate, the retrograde doped layer comprising one of: doped silicon (Si), and doped silicon-germanium (Si—Ge);
forming a set of high mobility channel fins over the retrograde doped layer, each of the set of high mobility channel fins comprising at least one of: Si, and Si—Ge; and
forming a set of silicon fins adjacent the set of high mobility channel fins on a second portion of said substrate having no retrograde doped layer.

11. The method according to claim 10, further comprising forming a carbon liner over the retrograde doped layer.

12. The method according to claim 10, the forming the retrograde doped layer comprising performing an in situ doping process.

13. The method according to claim 12, the forming the set of high mobility channel fins comprising:
depositing the high mobility channel material over the retrograde doped layer;
patterning the high mobility channel material and the substrate; and
etching the high mobility channel material and the substrate.

14. The method according to claim 13, the depositing comprising growing the high mobility channel material using a chemical vapor deposition of at least one of: Si, and Si—Ge.

15. The method according to claim 11, the forming the retrograde doped layer comprising:
forming an opening in the substrate;
depositing the high mobility channel material in the opening; and
performing a counter dopant retrograde implant to form the retrograde doped layer over the substrate in the opening.

16. The method according to claim 15, further comprising performing a retrograde carbon implant to form the carbon liner over the retrograde doped layer.

17. The method according to claim 10, the forming the retrograde doped layer comprising performing a counter dopant retrograde implant to form the retrograde doped layer within the substrate.

18. The method according to claim 17, further comprising:
patterning an opening in a hardmask formed over the substrate prior to formation of the retrograde doped layer; and
performing a retrograde carbon implant to form the carbon liner over the retrograde doped layer.

19. A semiconductor device comprising:
a retrograde doped layer formed over a first portion of a substrate, the retrograde doped layer comprising one of: doped silicon (Si), and doped silicon-germanium (Si—Ge);
a set of high mobility channel fins formed over the retrograde doped layer, each of the set of high mobility channel fins comprising at least one of: Si, and Si—Ge; and
a set of silicon fins adjacent the set of high mobility channel fins on a second portion of the substrate, wherein the second portion having no retrograde doped layer.

20. The semiconductor device according to claim 19, further comprising a carbon liner formed over the retrograde doped layer, wherein the set of high mobility channel fins and the set of silicon fins are formed over the carbon liner.

* * * * *